United States Patent [19]

Geisler

[11] Patent Number: 4,823,081

[45] Date of Patent: Apr. 18, 1989

[54] INTERFERENCE MAGNETIC FIELD COMPENSATION METHOD WHICH INCLUDES SUPPLYING A CURRENT TO A COIL TO COMPENSATE THE FIELD

[75] Inventor: Reinhardt Geisler, Jesteburg, Fed. Rep. of Germany

[73] Assignee: Licentia Patent-Verwaltungs-GmbH, Frankfurt am Main, Fed. Rep. of Germany

[21] Appl. No.: 237,671

[22] Filed: Aug. 26, 1988

Related U.S. Application Data

[63] Continuation of Ser. No. 697,079, Jan. 21, 1985, abandoned.

[30] Foreign Application Priority Data

Feb. 4, 1984 [DE] Fed. Rep. of Germany ....... 3403982

[51] Int. Cl.$^4$ ..................... G01R 33/02; G01N 27/72; H01H 47/28

[52] U.S. Cl. .................................... 324/225; 324/244; 361/146

[58] Field of Search ............... 324/225, 224, 261, 262, 324/260; 361/143, 146, 149, 267

[56] References Cited

U.S. PATENT DOCUMENTS

| | | | |
|---|---|---|---|
| 2,776,403 | 11/1957 | Anderson et al. | 324/244 |
| 4,649,349 | 3/1987 | Chiron et al. | 324/244 |

FOREIGN PATENT DOCUMENTS

| | | |
|---|---|---|
| 0024307 | 3/1981 | European Pat. Off. . |
| 2929964 | 1/1981 | Fed. Rep. of Germany . |
| 2843034 | 2/1983 | Fed. Rep. of Germany . |
| 3132933 | 9/1984 | Fed. Rep. of Germany . |
| 1503451 | 11/1967 | France . |
| 2455777 | 4/1975 | France . |
| 2510805 | 2/1983 | France . |
| WO80/02017 | 10/1980 | PCT Int'l Appl. . |
| 581801 | 10/1946 | United Kingdom . |
| 599294 | 3/1948 | United Kingdom . |
| 604329 | 7/1948 | United Kingdom . |
| 1047468 | 11/1966 | United Kingdom . |
| 1595203 | 8/1981 | United Kingdom . |

*Primary Examiner*—Reinhard J. Eisenzopf
*Assistant Examiner*—Walter E. Snow
*Attorney, Agent, or Firm*—Spencer & Frank

[57] ABSTRACT

Method for compensating the interference magnetic field of an object by means of an interference field controlled magnetic self-protection system having a coil system connected to receive a magnetic field producing current and oriented to produce a magnetic field tending to compensate the interference magnetic field, which method includes: monitoring a magnetic field difference at a selected location relative to the object; providing a representation of the value of the magnetic moment of the object; and controlling the current supplied to the coil in dependence on the monitored magnetic field difference and the value of the magnetic moment.

16 Claims, 4 Drawing Sheets

INTERFERENCE MAGNETIC FIELD COMPENSATION METHOD WHICH INCLUDES SUPPLYING A CURRENT TO A COIL TO COMPENSATE THE FIELD

This application is a continuation of application Ser. No. 06/697,079, filed Jan. 21st, 1985 now abandoned.

BACKGROUND OF THE INVENTION

The present invention relates to a method for compensating the interference magnetic field of an object by means of an interference field controlled magnetic self-protection system having a winding connected to receive a magnetic field producing current and oriented to produce a magnetic field tending to compensate the interference magnetic field.

DE-OS [Federal Republic of Germany Laid-Open application] No. 2,929,964 discloses a method applied to objects such as ships wherein measured magnetic field gradients are integrated and utilized, by way of a closed control circuit, to generate a compensation current. The control process is completed as soon as the measured magnetic field gradient has become zero.

The interference magnetic field is described via three coordinates. It can be assumed that there is no general limitation with a cartesian coordinate system. In this coordination system, the magnetic field has two horizontal components Hx and Hy as well as the vertical component Hz. The abbreviated form $\Delta$ Hz, should present the rate of change in space of the magnetic field via the length $\delta z$ ($\Delta Hz \triangleq Hz(x1, y1, z1) - Hz(x1, y1, z1 + \delta z)$).

Magnetic field gradient probes are placed wherever probe zero coincides with the zero location of one's own field. If no such location can be found, a settable constant or field dependent effect is superposed over the probe measuring effect to compensate for the zero difference.

This prior art method still has certain drawbacks, e.g. the fact that variable object magnetizations cannot be compensated to a sufficient degree and, in the case of malfunctions, satisfactory emergency operation is not possible.

SUMMARY OF THE INVENTION

It is therefore an object of the present invention to provide a compensation method with which changes in the magnetic state of an object can be detected and compensated in the best possible manner.

The above and other objects are achieved, according to the invention, by a method for compensating the interference magnetic field of an object by means of an interference field controlled magnetic self-protection system having a winding connected to receive a magnetic field producing current and oriented to produce a magnetic field tending to compensate the interference magnetic field, which method comprises: monitoring a magnetic field gradient at a selected location relative to the object; providing a representation of the value of the magnetic moment of the object; and controlling the current supplied to the winding in dependence on the monitored magnetic field gradient and the value of the magnetic moment.

The method according to the invention results in a significant improvement of long-term stability compared to prior art systems.

To aid in understanding the method, the problem can be reduced to an object having a variable magnetic moment whose interference magnetic field in a spatial plane outside the object is to be compensated in the best possible manner, i.e. is to be caused to disappear as far as possible.

The interference magnetic field of an object, at the distances near to the object, is generally not definable by a single dipole; at least for an approximate definition of the interference field, a spatially expanded accumulation of dipoles must be assumed to exist as sources.

The present invention will be described in greater detail with reference to embodiments which are illustrated in the drawing.

DESCRIPTION OF THE PREFERRED EMBODIMENTS

Figure 1:
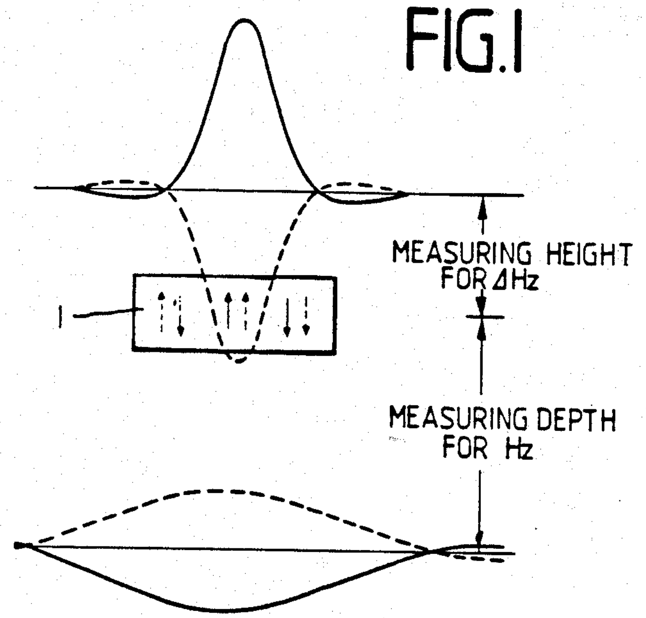
FIG. 1 is a pictorial view of an object having vertical interference moments and the curves for the magnetic field difference and for a magnetic field above and below the object.

FIG. 1 shows only vertical field components. The interference magnetic field $H_z$ of an object 1 in a plane below the object has its maximum below the magnetic center of gravity of object 1. The same applies for the magnetic field gradient $\Delta H_z$ above object 1. The values for $H_z$ and $\Delta H_z$, respectively, are shown in solid lines for positive and in broken lines for negative magnetization of object 1. The greatest measured effect in $\Delta H_z$, the regulating value for a control circuit, results if a vertical line from the gradient probe points toward the magnetic center of gravity.

The measuring height for $\Delta$ Hz (distance between object and $\Delta$ Hz-probe) and measuring depth for Hz (distance between object and Hz-probe) are selected in relation to the object size, x, as per the scale shown in FIG. 1. The measuring height is somewhat greater than half of the maximum object size, and the measuring depth is somewhat greater than the maximum object size. Naturally ratios can be selected which deviate from FIG. 1. The basic distance of the magnetometer (measuring distance of both sensors) is selected in such a way that there is a $\Delta$ Hz at the measuring height, whose value is approximately 2.5 times greater than the Hz at the measuring depth.

The measuring depth is obtained from the danger depth, the measuring height is obtained from local conditions, requirements on the magnetometer and from the extent of the interference fields of neighbouring objects.

The magnetizing directions are shown with arrows (positive=continuous, negative=broken). For clarification purposes, the arrows are not drawn over each other but instead, slightly apart.

ΔHz and Hz are marked accordingly, continuous for positive and broken for negative magnetization.

Figure 2:
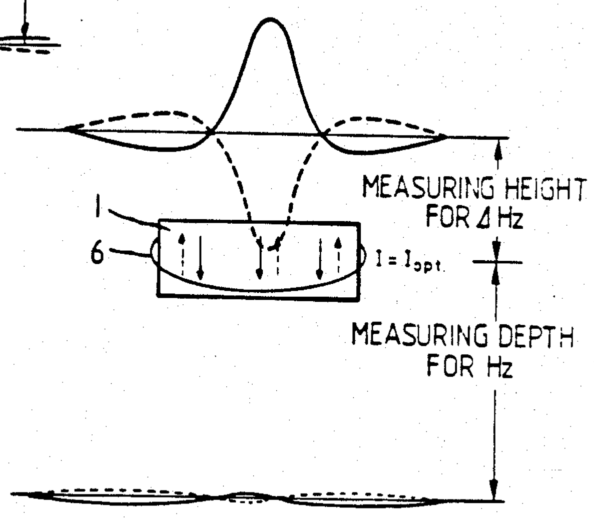
FIG. 2 is a view similar to that of FIG. 1 showing the optimum magnetic field compensation state.

The optimum compensation state according to FIG. 2 results for the selected compensation method employing a coil 6 through which flows a current I when the current is set to its optimum value i.e., $I=I_{opt}$. The compensation is considered to be at its optimum when the maximum field intensity value $|H|_{max}$ occurring in the measuring plane reaches its minimum. Other definitions of the optimum compensation state are also possible. The method described here can also be used analogously with other definitions.

FIG. 2 shows that, with optimum compensation as defined above, a value different than zero appears in ΔH, which value is reversed upon negative magnetization and thus for a negative optimal current I.

The term "own field zero" used in the above-mentioned prior art will hereinafter be replaced, for better understanding, by the term "optimum compensation." Although in such optimum compensation there are points, lines if considered in space, on which probe zero occurs, these points cannot be used for interference field control, since at these points the ΔH signal remains constantly at zero, regardless of the respective magnetization. It is therefore advisable to operate at the probe maximum according to FIG. 1. If a control circuit is set up to include an integrator, the illustration of FIG. 3 applies. Such a control circuit is described in DE-OS No. 2,929,964.

Figure 3:
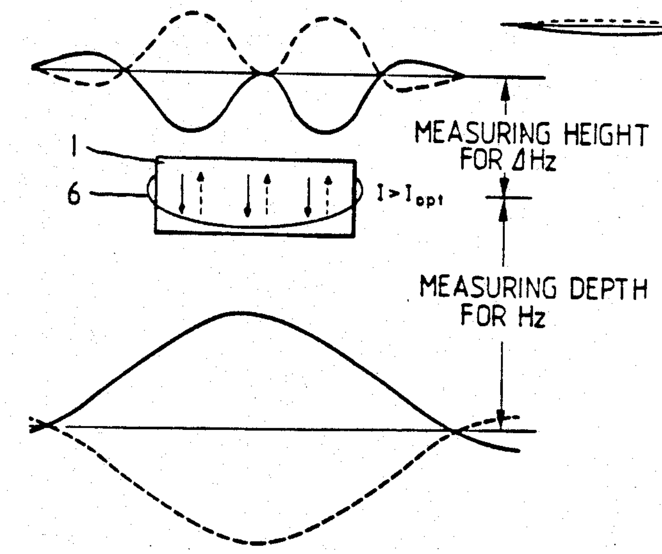
FIG. 3 is a view similar to that of FIG. 1 showing a prior art case where, independent of changes in magnetization of the object at the location of maximum field gradient, this maximum field gradient has been compensated to zero.

In FIG. 3, it is shown that, independently of changes in magnetization of the object at the location of maximum ΔH (according to FIG. 1), the latter is compensated to zero. However, then the field intensity H no longer corresponds to the optimum compensation according to FIG. 2 and changes when the magnetization of the object changes. In the case illustrated here, the interference field in the space plane has even become noticeably larger than would have been the case without the compensation loop. According to the solution of the present invention, the control of an interference field controlled system must be designed in such a manner that the optimum compensation state according to FIG. 2 is substantially maintained even if, and particularly if, there are changes in object magnetization. For that purpose, ΔH should generally not become zero as a result of operation of the control circuit, but must be regulated to an additional desired value other than zero. This desired value must be varied in dependence on the magnetization of the object.

Generally, the magnetization of an object is not known. Therefore, in practice, one usually employs derived values. Such a derived value for the average magnetization or for the magnetic moment, respectively, is, for example, the current $I_{opt}$ required for optimum compensation. If a signal derived from that current is used as the desired value for ΔH in the nontransient interference field controlled control circuit, the result is a sliding desired value formation during the transient period of the control circuit and upon changes in the magnetic state of the object. In this way, the optimum compensation state can be assured even if there are changes in the magnetic moment of the object.

The current signal can be linked with the field gradient information in a directly proportional manner or according to adapted, generally applicable relationships. This linkage is a function of the geometry of the object and of the compensation coils as well as of the location of placement of the field gradient probe. Additionally, the linkage applies for a fixed danger distance and must be newly adapted if this distance changes. The linkage may be effected by means of electronic addition of the signals or by magnetic addition, e.g. by means of an auxiliary or partial coil, respectively, which causes the compensation current to act primarily or particularly on the gradient magnetometer.

With such a control circuit it is possible, in principle, to meet all requirements of normal operation. In the case of a malfunction, it may be necessary to accept the fact that the compensation current runs up to its maximum value. The respective circuit can continue to operate with this maximum current or can be switched off completely. Both actions result in a considerably larger interference field for the object.

Continued operation leads to an over-compensated interference field and switching-off leads to the non-compensated condition. In both cases, the interference field is considerably greater than in the optimal compensated condition.

Malfunction may occur as a result of the failure of a part of the entire electronic.

These undesirable side-effects can be avoided by the additional use of a magnetometer to detect the motion-dependent extraneous magnetic field. This makes it possible, as in conventional systems, to compensate the induced magnetization in that the motion-dependent extraneous magnetic field is additively given to the power amplifier for the compensation current. Correspondingly, with a constant bias current, the average permanent share of the magnetization can be compensated. The current regulating range for an interference field controlled control circuit can thus be limited to the extent required in view of the remaining changes in the magnetic moments of the arrangement. Therefore, the control circuit can be switched off during such a malfunction so that the conventional magnetic self-protection system compensation is available for emergency operation.

A magnetic self-protection system magnetometer can be used as magnetometer for the above mentioned purpose. With the appropriate design of the magnetometer, the magnetic field information is available in any case without requiring additional expenditures. If no external magnetic field exists or the occurring magnetic field gradients are large compared to a large-area external magnetic field, the magnetic field gradient measurement can be replaced, as a substitution measure, by measuring the magnetic field of the interference field.

The motion-dependent external magnetic field may be for instance the magnetic field of the earth. During movement from North to South the vertical component Hz changes and the induced vertical magnetic moment of the object varies accordingly.

If the external field is small or if the magnetic field difference is high compared to the external field, there is no need for suppression of the external field via the magnetometer. Therefore a magnetometer alone can be used to build up current control in the same manner.

It is also possible to use a plurality of such interference field controlled magnetic self-protection system control circuits for different partial elements of an object. In this case, the control circuits can operate essentially independently of one another or may be composed of one primary control circuit and a plurality of subordinate control circuits.

Although the discussion above centered primarily on one magnetization direction and one compensation coil, the method can also be used in connection with a plurality of magnetization and compensation axis directions.

To significantly facilitate the construction of complex control circuits of this type, crosscoupling due to crosstalk between individual control circuits and reactive effects on the control circuit under consideration from other compensation devices are minimized by additional compensation.

The compensation may also be effected by means of a matrix whose coefficients are determined by way of measurements or calculations.

Compensation for crosscoupling and reactive effects can also be effected by way of electronic linkage with the outputs of the magnetometers or by magnetic influence on the probes. It is further possible to compensate crosscoupling and reactive effects by linking together the coil currents or their compensation fields, respectively. These compensation measures may be used individually or in combination with one another.

Optimization of such circuits can also be effected in that, at the danger distance under consideration, the differences or gradients, respectively, in the interference field are brought down to a minimum.

Additionally, a special design of the compensation coil systems may lead to substantial coincidence of the magnetic field curves and magnetic field gradient curves between the object field and the coil field. In practice, this will be limited to the danger distance and/or to all or some probe locations.

It is here also possible to effect, for example, overmatching with respect to the magnetic field gradients; this means that the magnetic field gradients of the respective coil system are made greater than the object gradient fields to be measured. In this way the overall measuring effect is increased and the quality of the gradient probes need not be so high. Such matching or overmatching, respectively, may be effected to advantage in practice, for example by means of additional or partial coils. The sliding desired value formation of the control circuit by way of the coil current is used to compensate, according to a suitable scale, the remaining error in matching.

Figure 4:
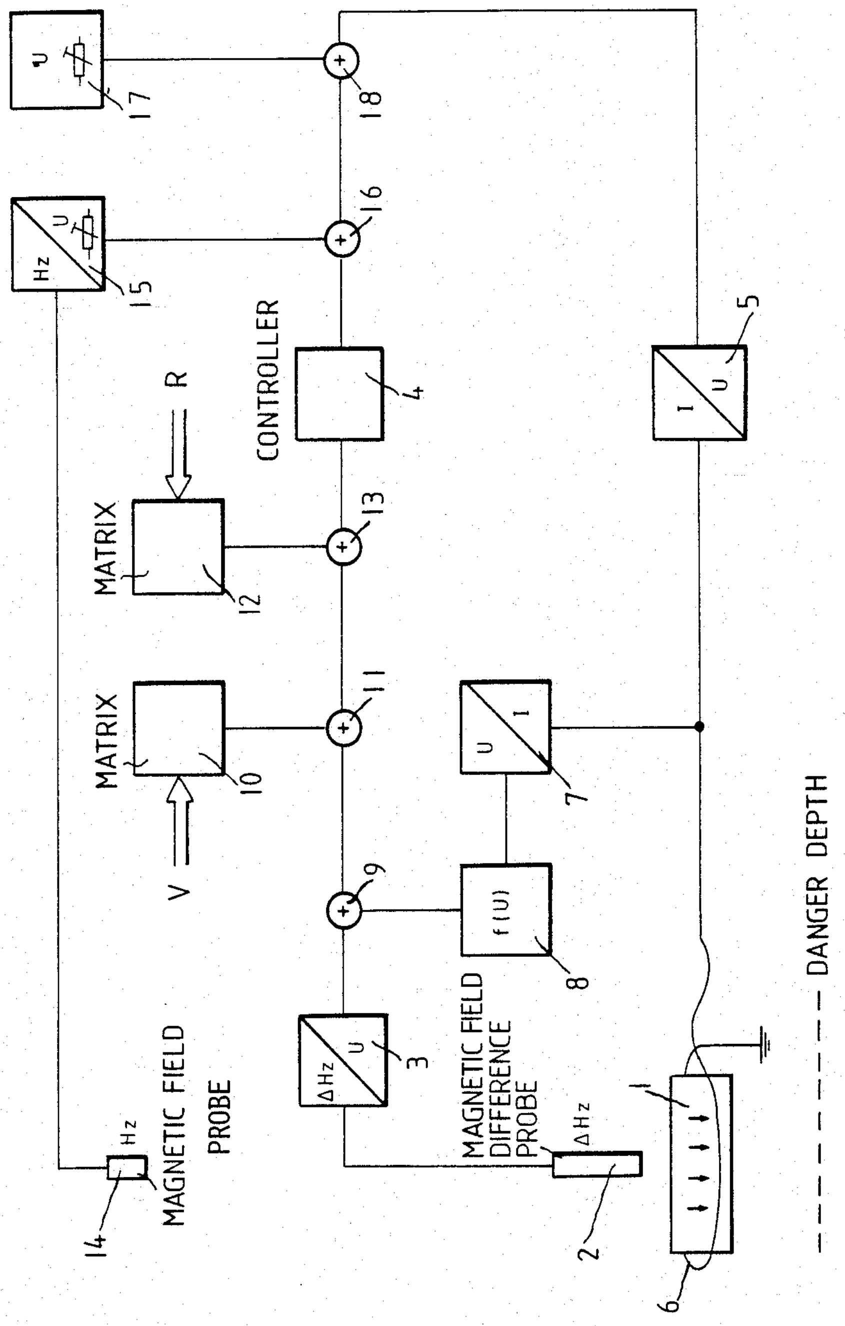
FIG. 4 is a block circuit diagram for a control circuit for implementing the invention.

In the block circuit diagram of an interference magnetic field controlled self-protection system control circuit shown in FIG. 4, object 1 is shown as being vertically magnetized. The vertical magnetic field gradient $\Delta H_z$ is detected by a magnetic field gradient probe 2 and converted into a voltage in a conventional field gradient/voltage converter 3. A controller 4 and a voltage/current converter 5 generate a current in compensation coil 6 which produces a magnetic field that counteracts, or neutralizes, the magnetization of object 1. A voltage is derived from the compensation coil current in a current/voltage converter 7 and a matching circuit 8 and, with the correct sign, is added, in an adder 9, to the gradient field voltage from converter 3.

To compensate crosscoupling from the remaining space axes of the object (which are not shown in this figure for the sake of simplicity) and the associated separate compensation coils, the magnetic field differences and/or the compensation currents of the remaining space axes are linked together in a V matrix 10 and the result is fed into the control circuit via an adder 11.

To compensate reactive effects from other, adjacent self-protection or compensation devices of the entire object 1 or of component parts of object 1, the compensation currents and/or the magnetic field gradients from these compensation devices are linked in an R matrix 12 and the result is additively fed to the control circuit via an adder 13.

The motion dependent magnetic field of object 1 is measured by magnetic field probe 14 and is converted, in an electronic system 15 in the form of a field/voltage converter, into a suitably scaled voltage which is additively fed, downstream of controller 4, to the circuit via an adder 16. By way of an adjustable constant voltage source 17, current/voltage converter 5 is additionally supplied with a constant bias which is fed to the control circuit via an adder 18.

The additive feeding at adders 16 and 18 serves to effect a coarse compensation of the induced or the permanent share, respectively, of the magnetization of object 1 and is also suitable for emergency operation if the interference field controlled magnetic self-protection system control circuit should become inoperative.

Adder circuits 16 and 18 are provided to add signals from devices 15 and 17 to the control loop. Emergency operation would be employed if the primary input for the system, e.g., probe 2, should fail. In this case, emergency operation involves effecting a coarse compensation of magnetization on the basis of the output of probe 14 and a preset voltage supplied by device 17.

The invention design shown in FIG. 4, corresponds to one version of the invention.

If a design is used in which control is not dependent on an external magnetic field, components 14, 15 and 16 will be removed without replacement.

If, on the other hand, control is dependent on a magnetic field instead of a field gradient, the components 14, 15 and 16 are removed without replacement and the magnetic field gradient probe 2 is exchanged for a magnetic field probe and in addition, the field gradient/voltage converter 3 is exchanged for a field/voltage converter.

Figure 5:
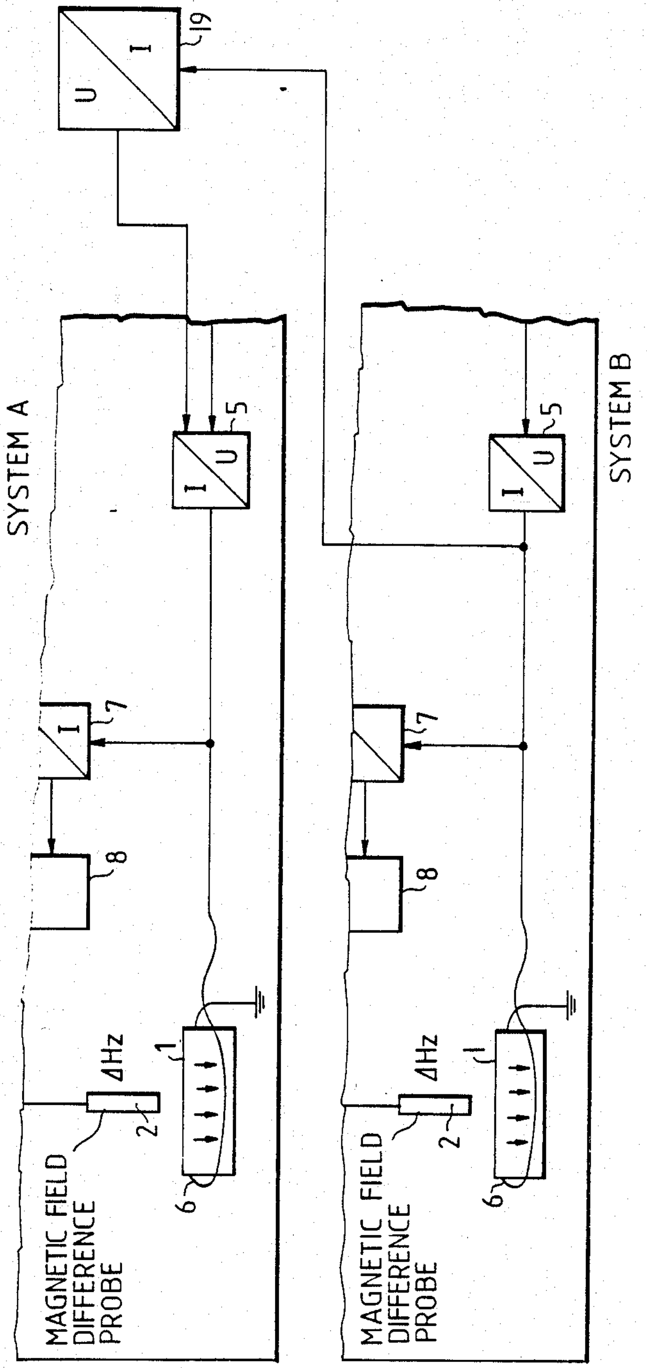
FIG. 5 is a block circuit diagram for compensating of the reactive effect by linking the compensation currents.

In FIG. 5 the step of compensating is effected via linking the current supplied to the winding. Two neighbouring systems A and B are shown, which are assumed to be so close to one another, that their magnetic fields affect one another. The reactive effect of system B on system A is compensated in such way that the compensation current of system B via the current converter 19 affects the voltage/current converter 5 of system A. With the correct scaling, the magnetic reaction of B on A is compensated by linking the compensation currents of both systems.

Figure 6:
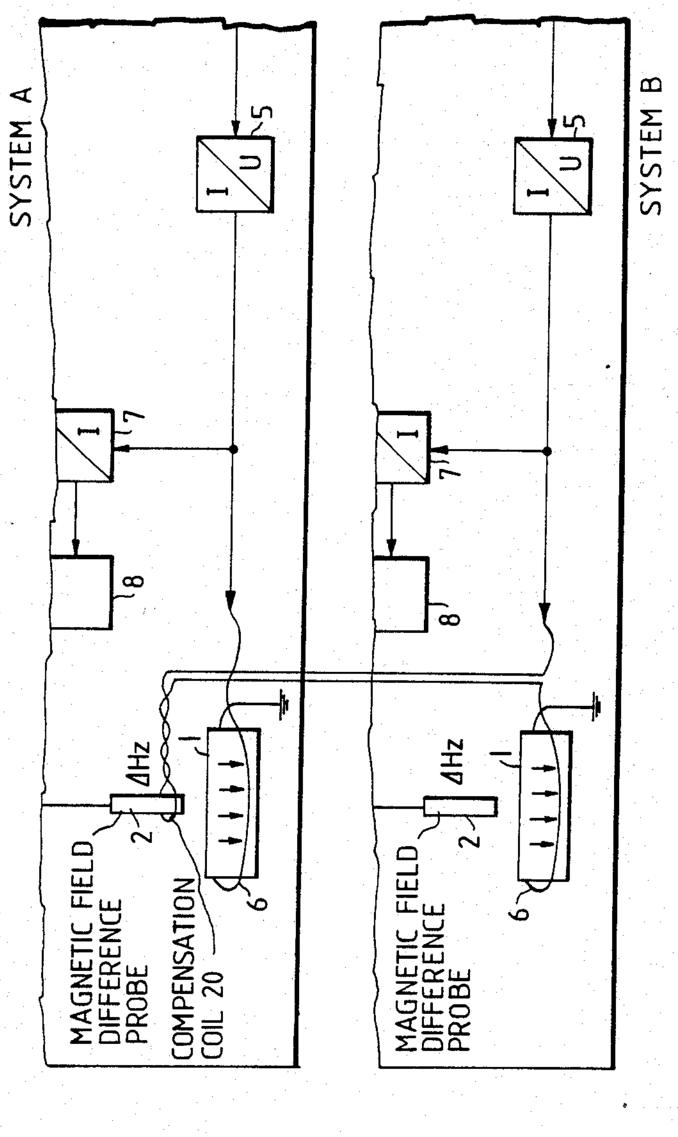
FIG. 6 is a block circuit diagram for compensating of the reactive effect by linking the magnetic fields.

In FIG. 6 the step of compensating is effected by linking the compensating magnetic field. Again, there are two neighbouring systems A and B, which are assumed to be so close to one another that their magnetic fields affect each other. The reactive effect of system B on system A is compensated by the installation of a compensation coil 20 in system A, which has current flowing through it from the coil current of coil 6 of system B. With the correct scaling, the magnetic reaction of B on A can be compensated via a magnetic effect on system A (in FIG. 6 it is a magnetic effect from system B acting on the magnetic field gradient probe 2 of system A).

FIGS. 5 and 6 illustrate portions of the system of FIG. 4 in combination with a corresponding portion of a second system which monitors a different object or a different part of the same object. In FIG. 5, the compensation signal associated with system B is utilized to control the compensation performed for system A. In the embodiment of FIG. 6, the compensating current to the coil 6 of system B, is additionally fed to influence the reading of magnetic difference probe 2 of system A. In each case, the effect of the object in system B on the magnetic field of system A is compensated. Since the magnitude of the current supplied to coil 6 of a given system is a function of the interference field of the object 1 of that system, use of that current to additionally control the coil current to the object of the other system can serve to cancel out the effects of the magnetic field of the object of one system on the object of the other system.

In accordance with the design in FIG. 5 and FIG. 6 the reactive effect of system A on system B can also be compensated. This also applies to several participating systems. Such a compensation is not restricted to the reactive effects of several systems but is also possible for the crosscoupling, which by using the entire invention can occur by acting on several spatial axes of an object.

It will be understood that the above description of the present invention is susceptible to various modifications, changes and adaptations, and the same are intended to be comprehended within the meaning and range of equivalents of the appended claims.

What is claimed is:

1. A method for compensating the interference magnetic field of an object located in an external magnetic field by means of an interference field controlled magnetic self-protection system having a coil system connected to receive a magnetic field producing current and oriented to produce a magnetic field tending to compensate the interference magnetic field, said method comprising: generating a first signal by measuring the magnetic field gradient of the interference magnetic field of the object and coil system at a selected location relative to the object; generating a second signal from the current through the coil system to provide a representation of the value of the magnetic moment of the object; and controlling the current supplied to the coil system in dependence on at least the first and second signals, to give a minimum interference magnetic field and to maintain a minimum interference field in case of changes in the magnetic moment of the object.

2. A method as defined in claim 1, wherein said step of controlling the current is carried out using, in addition to the first and second signals, a measured value of the external field not influenced by the interference magnetic field.

3. A method as defined in claim 1, wherein the step of controlling the current is carried out in a plurality of mutually cooperating control circuits.

4. A method as defined in claim 1, carried out with respect to a plurality of spatial axes associated with the object.

5. A method as defined in claim 1, wherein the step of controlling the current is carried out in a control system which is in the vicinity of other control systems.

6. A method as defined in claim 1, wherein said step of controlling the current further comprises compensating for crosscoupling and reactive effects influencing the result of said step of generating a first signal.

7. A method as defined in claim 1, wherein said step of controlling the current is carried out so that compensation of the interference field is affected by an appropriate setting of control circuit parameters so that differences between interference fields and interference field gradients, respectively, are compensated optimally at a danger distance.

8. A method as defined in claim 6, wherein said step of compensating comprises deriving compensation signals by processing signals representative of the cross coupling in a matrix whose coefficients are determined on the basis of the magnitudes of the crosscoupling effects.

9. A method as defined in claim 6, wherein said step of compensating comprises deriving compensation signals by processing signals representative of the reactive effects in a compensation matrix whose coefficients are determined on the basis of the magnitudes of the reactive effects.

10. A method as defined in claim 6, wherein said step of generating a first signal is carried out by means of a magnetic field gradient magnetometer, and said step of compensating is carried out by adding electrical compensation signals to the output signal of the gradient magnetometer.

11. A method as defined in claim 6, wherein said step of generating a first signal is carried out by means of a magnetic field gradient probe, and said step of compensating is carried out by adding electrical compensation signals to the output signal of the gradient probe.

12. A method as defined in claim 6, wherein said step of compensating is carried out by linking the currents supplied to the coil system.

13. A method as defined in claim 6, wherein said step of compensating is carried out by linking compensating magnetic fields generated by the currents and the coil system.

14. A method for compensating the interference magnetic field of an object located in an external magnetic field by means of an interference field controlled magnetic self-protection system having a coil system connected to receive a magnetic field producing current and oriented to produce a magnetic field tending to compensate the interference magnetic field, said method comprising: generating a first signal by measuring the magnetic field of the object and coil system at a selected location relative to the object in the case of high magnetic field values at the selected location compared to the external field; generating a second signal from the current through the coil system to provide a representation of the value of the magnetic moment of the object; and controlling the current supplied to the coil system in dependence on at least the first and second signals, to give a minimum interference magnetic field and to maintain a minimum interference field in case of changes in of the magnetic moment of the object.

15. A method for compensating the interference magnetic field of an object located in an external magnetic field by means of an interference field controlled magnetic self-protection system having a coil system connected to receive a magnetic field producing current and oriented to produce a magnetic field tending to compensate the interference magnetic field, said method comprising: generating a first signal by measuring the magnetic field gradient of the interference magnetic field of the object and coil system at a selected location relative to the object if the field gradient is below a predetermined value, and generating the first signal by measuring the interference magnetic field of the object and coil system at the selected location relative to the object if the field gradient is larger than the predetermined value; generating a second signal from the current through the coil system to provide a representation of the value of the magnetic moment of the object; and controlling the current supplied to the coil system in dependence on at least the first and second signals, to give a minimum interference magnetic field and to maintain a minimum interference field in case of changes in the magnetic moment of the object.

16. A method as defined in claim 1, wherein the step of generating a second signal is carried out by measuring the current through the coil system to obtain a derived value of the magnetic moment.

* * * * *

UNITED STATES PATENT AND TRADEMARK OFFICE

CERTIFICATE OF CORRECTION

PATENT NO. : 4,823,081 Page 1 of 2

DATED : April 18, 1989

INVENTOR(S) : Reinhardt Geisler

It is certified that error appears in the above-identified patent and that said Letters Patent is hereby corrected as shown below:

In the drawings "Sheet 1 of 4" should appear as follows on the attached sheets.

Signed and Sealed this

Fifteenth Day of January, 1991

*Attest:*

HARRY F. MANBECK, JR.

*Attesting Officer* *Commissioner of Patents and Trademarks*

UNITED STATES PATENT AND TRADEMARK OFFICE
CERTIFICATE OF CORRECTION

PATENT NO. : 4,823,081

DATED : April 18th, 1989

INVENTOR(S) : Reinhardt GEISLER

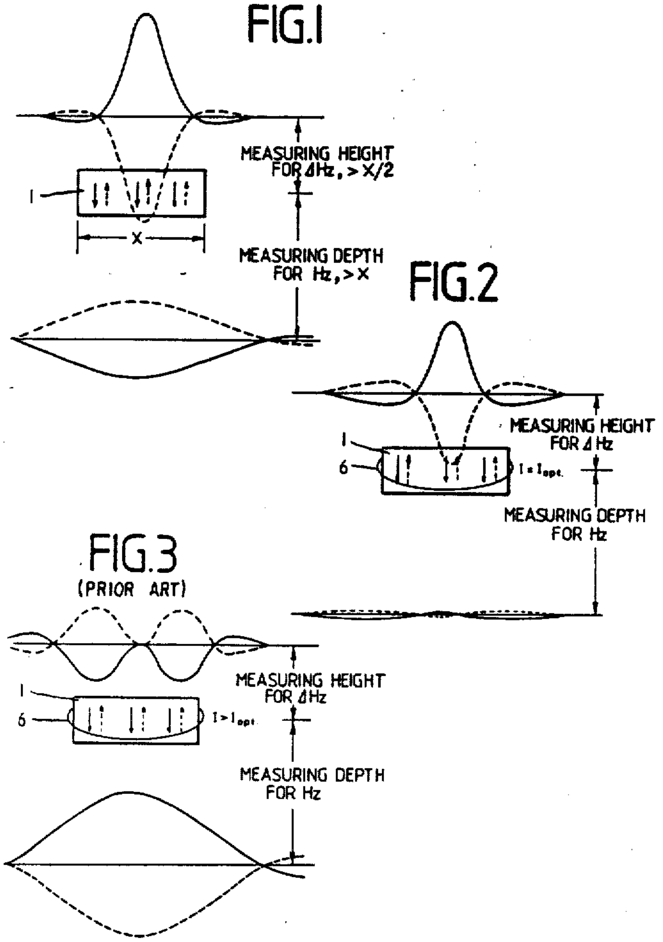

It is certified that error appears in the above-identified patent and that said Letters Patent is hereby corrected as shown below: